United States Patent [19]

Becerra et al.

[11] Patent Number: 5,710,689
[45] Date of Patent: Jan. 20, 1998

[54] OVERCURRENT PROTECTION FOR AN INK-JET PRINTHEAD

[75] Inventors: Juan J. Becerra, Webster; Sophie V. Vandebroek, Penfield, both of N.Y.

[73] Assignee: Xerox Corporation, Stamford, Conn.

[21] Appl. No.: 668,807

[22] Filed: Jun. 24, 1996

[51] Int. Cl.[6] ............................................. H02H 9/00
[52] U.S. Cl. .............................. 361/57; 361/87; 361/101
[58] Field of Search .................................. 361/54–57, 93, 361/100–101, 111, 88, 78, 79, 86–87; 257/355–363

[56] References Cited

U.S. PATENT DOCUMENTS

| | | | |
|---|---|---|---|
| 5,229,635 | 7/1993 | Bessolo et al. | 257/360 |
| 5,319,515 | 6/1994 | Pryor et al. | 361/93 |
| 5,424,892 | 6/1995 | Topp et al. | 361/18 |
| 5,444,590 | 8/1995 | LeComte et al. | 361/18 |
| 5,455,732 | 10/1995 | Davis | 361/90 |
| 5,576,557 | 11/1996 | Ker et al. | 257/173 |

*Primary Examiner*—Jeffrey A. Gaffin
*Assistant Examiner*—Michael J. Sherry
*Attorney, Agent, or Firm*—R. Hutter

[57] ABSTRACT

A protection circuit prevents snapback events in MOS transistors associated with semiconductor or micromechanical structures, such as ink-jet ejectors. A bulk electrode associated with the MOS transistor is monitored for unusual high voltages which are consistent with an impending snapback event. The voltage on the bulk electrode is then used to turn on the control transistor which connects the gate of the MOS transistor to ground and thereby protects the device.

3 Claims, 4 Drawing Sheets

OVERCURRENT PROTECTION FOR AN INK-JET PRINTHEAD

The present invention relates to an overcurrent protection device for semiconductor or micromechanical devices, particularly ink-jet printheads.

In thermal ink-jet printing, droplets of ink are selectably ejected from a plurality of drop ejectors in a printhead. The ejectors are operated in accordance with digital instructions to create a desired image on a print sheet moving past the printhead. The printhead may move back and forth relative to the sheet in a typewriter fashion, or the linear array may be of a size extending across the entire width of a sheet, to place the image on a sheet in a single pass.

The ejectors typically comprise capillary channels, or other ink passageways, which are connected to one or more common ink supply manifolds. Ink is retained within each channel until, in response to an appropriate digital signal, the ink in the channel is rapidly heated and vaporized by a heating element (essentially a resistor) disposed on a surface within the channel. This rapid vaporization of the ink adjacent the channel creates a bubble which causes a quantity of ink to be ejected through an opening associated with the channel to the print sheet. One patent showing the general configuration of a typical ink-jet printhead is U.S. Pat. No. 4,774,530, assigned to the assignee in the present application.

In overview, a thermal ink-jet printhead such as of typical designs known in the art is a hybrid of a semiconductor and a micromechanical device. The heating elements are typically polysilicon regions doped to a particular resistivity, and of course the associated digital circuits for activating individual heating elements at various times are all well within the realm of semiconductor technology. Simultaneously, structures such as the capillary channels for retaining liquid ink and ejecting the ink from the printhead are mechanical structures which directly physically interface with the semiconductors such as the heating element or heater chip. For various reasons it is desirable to make mechanical structures such as the channel plate out of chemically etched silicon which is congruous with the semiconductor structure of the heater plate.

Within a device, such as a thermal ink-jet printhead, in which control circuitry is closely connected with a micromechanical heating element, an important design concern is the disparity of power level between the control portions of the device and the electromechanical portions. In a typical thermal ink jet printhead, for example, the digital signals which are used to activate particular ejectors at particular times to print an image typically operate at 5–15 volts: these relatively small voltages are used to drive transistors which activate heating elements. The heating elements, in turn, typically require voltages in the range of 50–100 volts in order to provide the desired nucleation of liquid ink adjacent the heating element. If, through a short circuit or other malfunction, the relatively high voltage used for the heating element somehow connects with control circuitry, the control circuitry may become irreparably damaged. Such a short circuit is likely to be caused, for example, by infiltration of liquid ink under the heating element in the semiconductor chip in an ink-jet printhead; in the case of other devices, such as an LED in a display panel, a short circuit is likely to be caused by a screwdriver or metal probe when the panel is being serviced. There is therefore a need in semiconductor and/or micromechanical devices, such as thermal ink-jet printheads, to provide overvoltage protection for the control circuitry.

In the prior art, U.S. Pat. No. 5,319,515 discloses a circuit protection arrangement in which the base or gate of a switching transistor is held in a voltage divider, one arm of which comprises a control transistor whose base or gate is itself held in the voltage divider. When an overcurrent is experienced, the control transistor switches on, causing the switching transistor to turn off.

U.S. Pat. No. 5,444,590 discloses a power controller for switching power on and off to an electrical load. When a current overload exists, the controller interrupts current to the load in a time inversely proportional to the square of the magnitude of the overload. The apparatus also includes including a MOSFET protection section which produces an analog voltage proportional to the MOSFET temperature rise and provides a trip signal when the allowable temperature rise of the MOSFETs, simulated by a reference voltage, is reached.

U.S. Pat. No. 5,455,732 discloses a protection circuit in which overvoltages, which are detected by a comparator, cause the protection circuit to substitute a voltage input, such as from a voltage rail, with a pseudo-voltage.

It is also known in the art to detect overvoltages to a transistor gate by sampling a voltage at the drain or source of the transistor, and using a feedback-control system to cause the gate to open when the measured voltage exceeds a predetermined amount.

According to one aspect of the present invention, there is provided a semiconductor device providing overcurrent protection. A MOSFET defines a drain, a source, a gate, and a bulk electrode. A control transistor, having a base connected to the bulk electrode, is configured to connect the gate of the MOSFET to a safe potential in response to a current of a predetermined magnitude flowing in the bulk electrode.

According to another aspect of the present invention, there is provided a thermal ink-jet printhead, comprising a resistor functioning as a heating element. A MOS transistor is associated with the resistor to selectably allow a current to pass through the resistor. The MOS transistor defines a drain, a source, a gate, and a bulk electrode. A control transistor, having a base connected to the bulk electrode, is configured to connect the gate of the MOS transistor to a safe potential in response to a current of a predetermined magnitude flowing in the bulk electrode.

Figure 1:
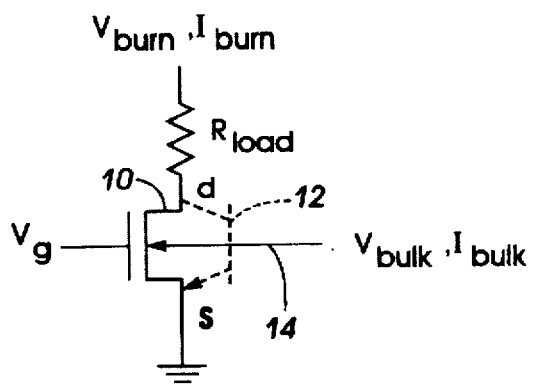
FIG. 1 is a simplified schematic view of a gate which would be used, for example, in a thermal ink-jet printhead to activate the heating element therein.

FIG. 1 is a simplified schematic view of a MOS transistor which would be used, for example, in a thermal ink-jet printhead to activate the heating element therein. In a thermal ink-jet printhead, a MOS transistor, indicated as 10, is operated by a gate voltage ($V_g$) to selectively connect or disconnect a burn voltage an associated burn current $V_{burn}$, ($I_{burn}$) to activate a resistor R, which could be a heating element. A bipolar transistor, here indicated in phantom as 12, is configured as a parasitical element to the MOS transistor. The parasitic bipolar transistor is shown having a collector (drain d of the MOS transistor) and an emitter (source s of the MOS transistor). The base of this bipolar transistor 12 is, from the perspective of the MOS transistor 10, a "bulk electrode", here indicated as 14, on which will be apparent a bulk voltage and a bulk current ($V_{bulk}$, $I_{bulk}$).

Figure 2:
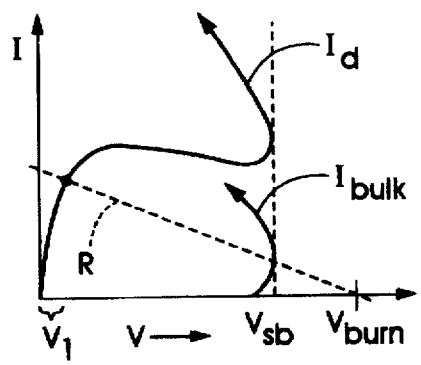
FIG. 2 is a voltage-current graph illustrating the undesirable "snapback" property of a semiconductor gate such as shown in FIG. 1.

Turning now to FIG. 2, which is a voltage-current diagram showing the behavior of a MOSFET 10, the line $I_d$ is the current at the drain of the transistor 12 as the voltage applied thereon increases. At relatively low voltages, such as in the range indicated as $V_1$, the response of the MOS transistor 10, shown as $I_d$, is generally parabolic. This represents the operating range for creating a desirable burn voltage on resistor R, such as to nucleate liquid ink in a thermal ink jet printhead. The load resistance is shown as the slope R in FIG. 2. The range of $V_1$, which intersects with the resistance R, thus represents a usable range of voltage and current for the printhead. At voltages over the range $V_1$ additional voltage does not create more current at the drain and, in fact, decreases as voltage increases; this is a well-known property of semiconductor devices such as transistors.

However, if the voltage across the MOS transistor increases to relatively high level, such as shown as "snapback" voltage ($V_{sb}$), the excess voltage attacks the lattice structure of the device itself, effectively destroying the device and creating the "backwards" behavior of $I_d$, as the bulk-source junction of the MOS transistor 10 becomes forward biased and a significant component of the drain current starts flowing through the bulk. Such "snapback" conditions can occur, as mentioned above, when external conditions cause a Short relative to the resistor, such as infiltration of the resistor-heating element by corrosive liquid ink in an ink-jet printhead.

Also shown in FIG. 2 is the presence of a bulk current $I_{bulk}$ that is a current which appears on bulk electrode 14 when the bulk-source junction becomes forward biased. It will be noted, in FIG. 2, that there is generally no current on bulk electrode 14 for most of the range of voltages applied through the drain of MOS transistor 10; only as the dangerous snapback condition is approached does current appear on the bulk electrode 14. According to the present invention, this bulk current on bulk electrode 14 is detected and used to reduce the voltage applied to the MOSFET gate and hence shut off the MOS transistor 10. By using the presence of the current on the bulk electrode 14 as an "early warning," the MOS transistor 10 can then be shut off before being damaged by the snapback voltage.

Figure 3:
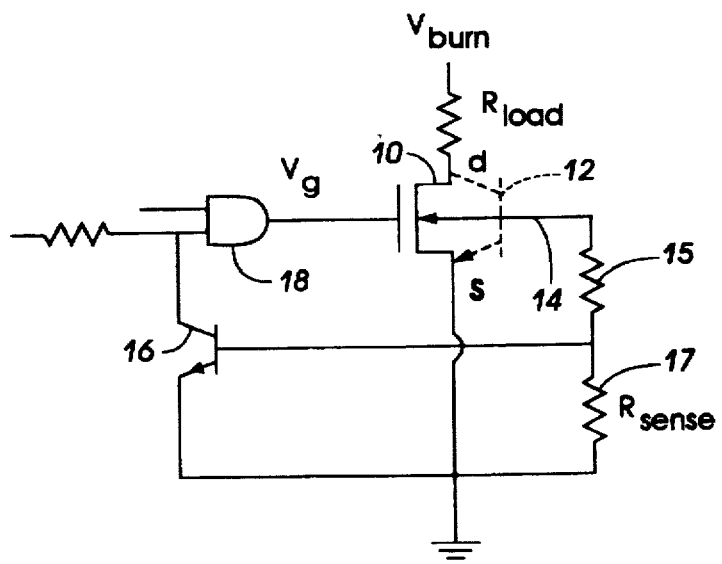
FIG. 3 is a schematic diagram showing the elements of one embodiment of the present invention.

FIG. 3 is a schematic view of a MOS transistor 10, such as shown in FIG. 1, with the protection circuit according to the present invention. Here, the bulk electrode 14 of the MOS transistor is associated with a base of a control transistor 16, which is preferably itself a bipolar transistor, triggered by a base current. Control transistor 16, in turn, is associated with the MOS transistor 10 to control the gate voltage ($V_g$). Looking generally at FIG. 3, it can be seen that when a current $I_{bulk}$ appears on bulk electrode 14, such as in the case when the voltage at drain d approaches the snapback voltage $V_{sb}$ of the parasitic bipolar transistor 12. The bulk current itself is used to close control transistor 16, which shorts out the gate voltage to MOS transistor 10, thereby causing MOS transistor 10 to shut off burn voltage $V_{burn}$. In this way, the presence of a current $I_{bulk}$ on bulk electrode 14 is used as an early warning that the voltage on the drain d is approaching a snapback level.

When a high current on bulk electrode 14 approaches a magnitude consistent with a snapback condition, the MOS transistor 10 is shut off by using control transistor 16 to reduce the potential on the gate of MOS transistor 10 to a safe operating level. In the Figure, this safe potential is illustrated as ground, but conceivably the safe potential on the gate of MOS transistor 10 could be any suitably low potential.

With further reference to FIG. 3, the collector of transistor 16 can be connected directly to the MOS transistor 10 or can be connected to another node in the circuitry that drives MOS transistor 10. As shown in FIG. 3, the collector of transistor 16 is connected to an AND gate 18, where it is conjoined with an external voltage source. As can be seen, only when there is a voltage on both inputs to AND gate 18 will there be a voltage on MOS transistor 10, which in turn will cause current to pass through MOS transistor 10. If the input on the collector of transistor 16 is caused to be grounded the lack of a voltage input to one input of AND gate 18 will stop the voltage onto the MOS transistor 10. This AND gate 18 may be in the form of an actual discrete AND gate, or some equivalent circuitry having this function can be provided as well.

According to a preferred embodiment of the present invention, the gain of control transistor 16 should be greater than the gain of the parasitic bipolar transistor 12; when this relationship holds, in general, the desirable situation will result of control transistor 16 causing the shut off of MOS transistor 10 before a snapback voltage is reached on transistor 12, thereby enabling the protective relationship of transistor 16 to MOS transistor 10. Further, there is provided, in a preferred embodiment of the invention, additional resistances 15 and 17 associated with the bulk electrode 14. In general, resistor 17 can be considered a "sense resistor" $R_{sense}$ which allows the bulk current $I_{bulk}$ on bulk electrode 14 to match a necessary activation voltage $V_{bulk}$ for the base of transistor 16, through the relationship $V_{bulk}$= $I_{bulk}$ $R_{sense}$. Similarly, a resistance 15 can be provided as shown to fine-tune the performance of the protection circuit to avoid snapback situations with MOS transistor 10.

Figure 4:
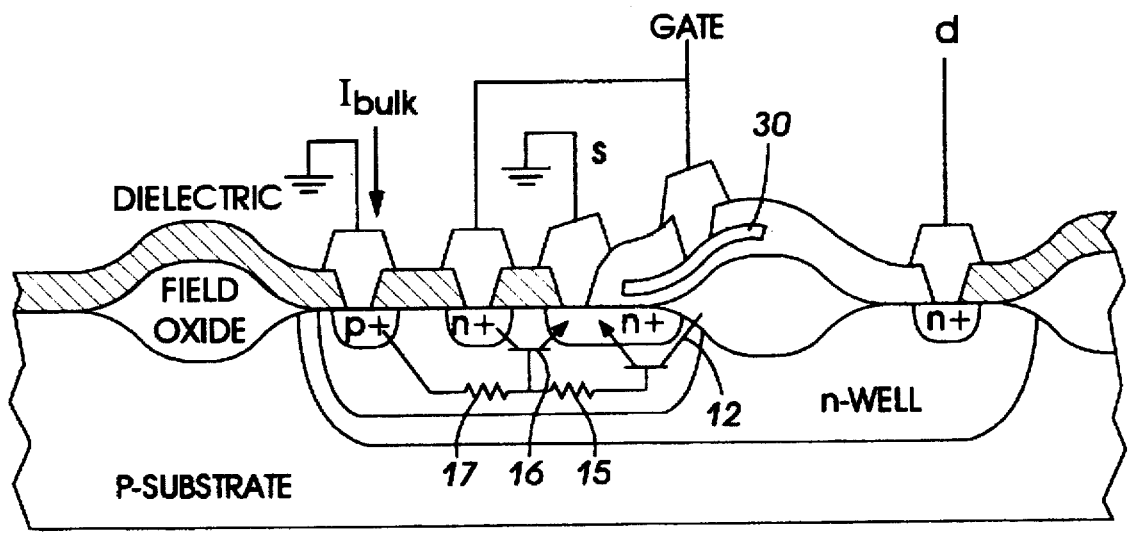
FIGS. 4 and 5 are sectional elevational views, respectively through two possible embodiments of the main elements shown in FIG. 3 in MOS circuitry.
Figure 5:
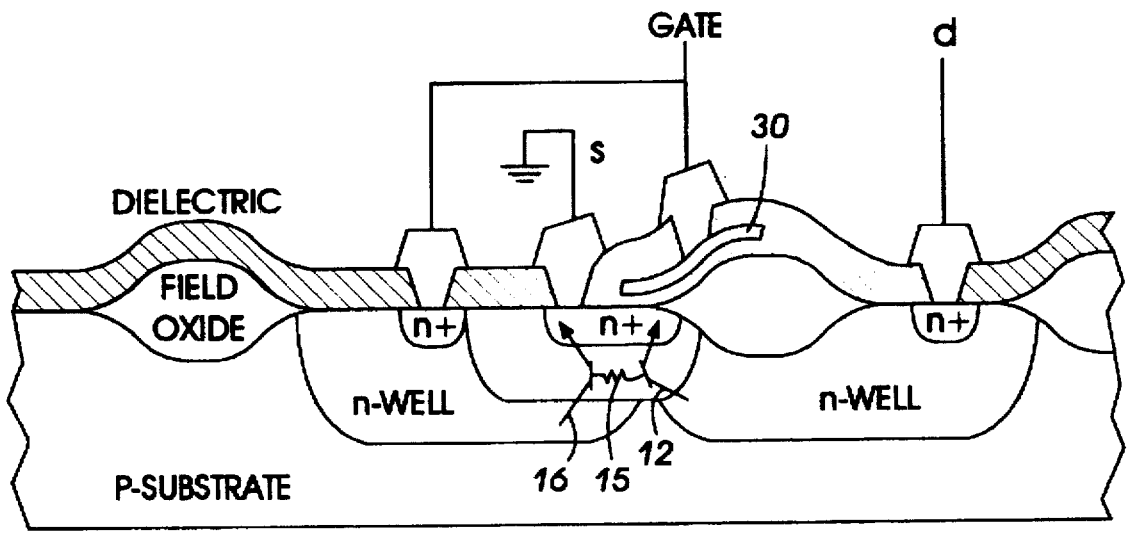

FIGS. 4 and 5 show, respectively, sectional elevational views of two possible DMOS embodiments of most of the circuitry shown in FIG. 3. Superimposed on the various structures shown in FIGS. 4 and 5 are portions of a schematic diagram showing the relationship of the elements shown in FIG. 3 to the structure shown in FIGS. 4 and 5. In FIGS. 3, 4, and 5, like numerals indicate like structures. The FIG. 4 embodiment shows transistor 16 as a lateral npn device, while FIG. 5 shows transistor 16 embodied as a vertical npn device. In either case, the transistor 12 forms a MOS transistor 10, particularly around the area as shown as poly-gate 30. As will be apparent to one of skill in the art, the structures shown in FIGS. 4 and 5 are generally placed on a P-substrate in the form of various implants and/or field oxide devices, as indicated.

Figure 6:
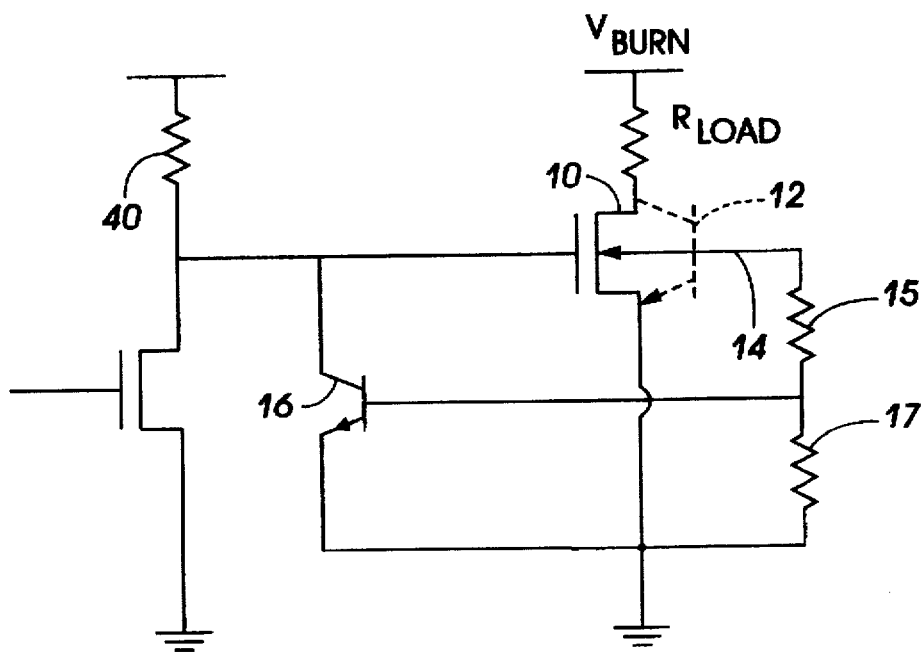
FIG. 6 is a schematic diagram of another embodiment of the present invention.

FIG. 6 is a schematic diagram showing an embodiment of the protection circuit according to the present invention, which may be preferred in certain situations. Instead of the functional AND gate shown in FIG. 3, there is provided a simple pull-up resistor 40 which, as shown, is connected to the collector of transistor 16 and to MOS transistor 10. The value of pull-up resistor 40 is related to the gain of transistor 16 in such a way that when a current on bulk electrode 14 causes transistor 16 to connect MOS transistor 10 to ground, the voltage associated with pull-up resistor 40 is pulled down. Manipulation of the values of resistor 40 and the gain of transistor 16 can be performed to fine tune the performance of MOS transistor 10, particularly in the sense of determining what voltage conditions must exist on bulk electrode 14 in order to cause MOS transistor 10 to re-open so that $V_{bum}$ will again be passed through MOS transistor 10.

Figure 7:
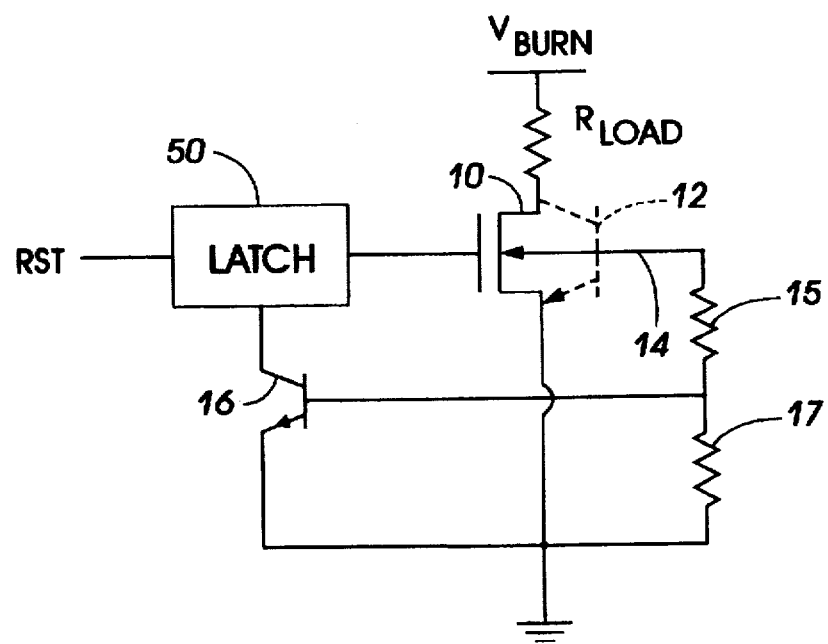
FIG. 7 is a schematic diagram of still another embodiment of the present invention.

FIG. 7 is a schematic diagram showing yet another possible embodiment of the present invention, wherein the interface between the collector of control transistor 16 and MOS transistor 10 includes a latch generally indicated as 50. (As will be known to one of skill in the art, a latch such as 50 may include any number of inputs and outputs; here only the relevant connections to the latch 50 are shown.) Under this embodiment, once current on bulk electrode 14 causes transistor 16 to pull current away from MOS transistor 10, the action of latch 50 will be to retain MOS transistor 10 in an off position so that MOS transistor 10 cannot be reopened without some external signal, such as to the reset input shown in FIG. 7. With such a system, once a high-voltage situation occurs and MOS transistor 10 is caused to turn off, the gate cannot be turned on again until the user, such as service personnel, provides the necessary reset signal.

Figure 8:
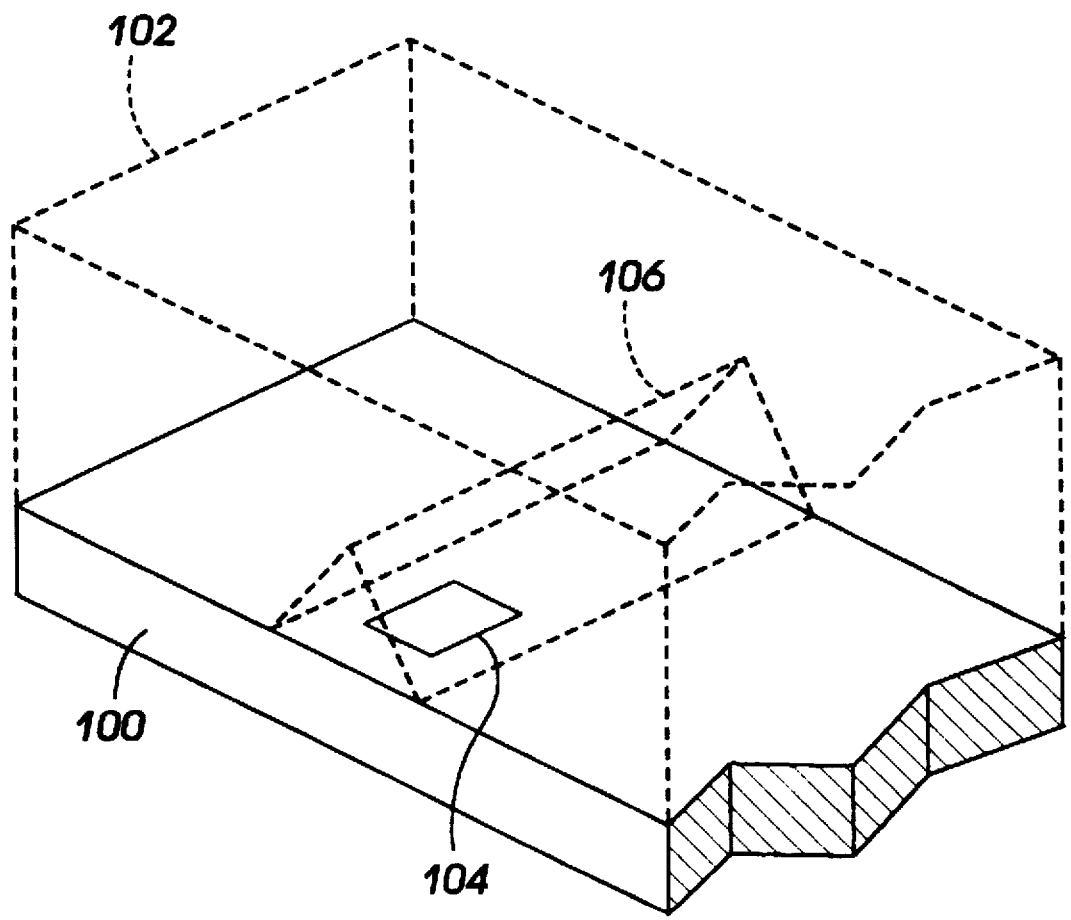
FIG. 8 is a simplified perspective view of an ejector of a thermal ink-jet printhead.

FIG. 8 is a highly simplified perspective view showing the portions of an ejector for a thermal ink-jet printhead incorporating the present invention. Although only one ejector is shown, it will be understood that a practical thermal ink-jet printhead will include 100 or more such ejectors, typically spaced at 300 to 900 ejectors per inch. Illustrated in FIG. 8 is the general configuration of what is known as a "side-shooter" printhead wherein the channels forming the ejectors are created between two chips which are bound together. The printhead comprises a heater chip 100, which is bound on a main surface thereof to a "channel chip" indicated in phantom as 102. The heater chip 100 is generally a semiconductor chip design as known in the art, and defines therein any number of heating elements, is such as indicated as 104, on a main surface thereof. There is typically provided one heating element 104 for every ejector in the printhead. Adjacent each ejector 104 on the main surface of heater chip 100 is a channel 106 which is formed by a groove in channel chip 102. Channel chip 102 can be made of any number of ceramic, plastic, or metal materials known in the art. When the chip 100 is abutted against the channel chip 102, each channel 106 forms a complete channel with the adjacent surface of the heater chip 100, and on heating element 104 is disposed a heating surface on the inside of the channel so formed. This heating element 104 is the load resistor $R_{load}$ described above.

While the invention has been described with reference to the structure disclosed, it is not confined to the details set forth, but is intended to cover such modifications or changes as may come within the scope of the following claims.

We claim:

1. A semiconductor device providing overcurrent protection, comprising:

a MOS transistor defining a drain, a source, a gate, and a bulk electrode;

a control transistor having a base connected to the bulk electrode, the control transistor being configured to connect the gate of the MOS transistor to a safe potential in response to a current of a predetermined magnitude flowing in the bulk electrode of the MOS transistor; and an AND gate having an input terminal connected to the control transistor and an output terminal connected to the gate of the MOS transistor.

2. A semiconductor device providing overcurrent protection, comprising:

a MOS transistor defining a drain, a source, a gate, and a bulk electrode;

a control transistor having a base connected to the bulk electrode, the control transistor being configured to connect the gate of the MOS transistor to a safe potential in response to a current of a predetermined magnitude flowing in the bulk electrode of the MOS transistor; and a pullup resistor and a voltage source, the voltage source connected through the pullup resistor to a collector of the control transistor and to the gate of the MOS transistor.

3. A semiconductor device providing overcurrent protection, comprising:

a MOS transistor defining a drain, a source, a gate, and a bulk electrode;

a control transistor having a base connected to the bulk electrode, the control transistor being configured to connect the gate of the MOS transistor to a safe potential in response to a current of a predetermined magnitude flowing in the bulk electrode of the MOS transistor; and a resettable latch having an input terminal connected to the control transistor and an output terminal connected to the gate of the MOS transistor.

* * * * *